(12) United States Patent
Lin et al.

(10) Patent No.: US 7,327,621 B2
(45) Date of Patent: Feb. 5, 2008

(54) CURRENT SENSE AMPLIFIER WITH LOWER SENSING ERROR RATE BY USING SMALLER SENSING CURRENT DIFFERENCE

(75) Inventors: Ching-Yuan Lin, Hsinchu County (TW); Hong-Ping Tsai, Hsinchu (TW)

(73) Assignee: eMemory Technology Inc., Hsinchu (TW)

( * ) Notice: Subject to any disclaimer, the term of this patent is extended or adjusted under 35 U.S.C. 154(b) by 236 days.

(21) Appl. No.: 11/164,485

(22) Filed: Nov. 24, 2005

(65) Prior Publication Data
US 2007/0117330 A1   May 24, 2007

(51) Int. Cl.
*G11C 7/02* (2006.01)

(52) U.S. Cl. .................. 365/207; 365/208; 327/52; 327/55

(58) Field of Classification Search ............ 365/206, 365/207, 208; 327/51, 52, 54, 55, 57
See application file for complete search history.

(56) References Cited

U.S. PATENT DOCUMENTS 6,476,646 B2 * 11/2002 Sim et al. ................. 327/55
2005/0068807 A1 * 3/2005 Ohsawa ................. 365/185.2

* cited by examiner

*Primary Examiner*—Van Thu Nguyen
(74) *Attorney, Agent, or Firm*—Jianq Chyun IP Office

(57) ABSTRACT

A sensing amplifier comprising a program cell current sensing circuit, an erase cell current sensing circuit and a latch circuit is provided. Each of the program and erase cell current sensing circuits further comprises a plurality of program/erase memory cells, a first NMOS transistor, a second NMOS transistor, a third NMOS transistor and a fourth PMOS transistor. Wherein, one of the drain/source of the first NMOS transistor is electrically coupled to both the program/erase memory cells and a gate of the third NMOS transistor to form a node. In addition, one of the drain/source of the third NMOS transistor is coupled to the latch circuit. Moreover, the program/erase memory cell provides a program/erase current to the first NMOS transistor. The latch circuit will be driven once the amount of the electric charges accumulated at the node caused by the program/erase current overcomes a threshold voltage of the third NMOS transistor.

15 Claims, 3 Drawing Sheets

CURRENT SENSE AMPLIFIER WITH LOWER SENSING ERROR RATE BY USING SMALLER SENSING CURRENT DIFFERENCE

BACKGROUND OF THE INVENTION

1. Field of the Invention

The present invention relates to a sensing amplifier circuit, and more particularly, to a sensing amplifier operated with a smaller sensing current difference.

2. Description of the Related Art

FIG. 1 schematically shows a circuit diagram of a conventional sensing amplifier. Referring to FIG. 1, the conventional sensing amplifier comprises a program memory cell 105, an erase memory cell 109, two NMOS transistors 101 and 103, and two inverters 113 and 115 served as a latch. Wherein, the program memory cell 105 provides a first driving current ION based on a bit data, and the erase memory cell 109 provides a second driving current IOFF based on the bit data.

As shown in FIG. 1, a first source/drain of the NMOS transistor 101 is grounded, a gate is electrically coupled to a control signal RE, a second source/drain is electrically coupled to an input terminal of the inverter 113, an output terminal of the inverter 115 and the program memory cell 105.

Similarly, a first source/drain of the NMOS transistor 103 is grounded, a gate is electrically coupled to the control signal RE, a second source/drain is electrically coupled to an output terminal of the inverter 113, an input terminal of the inverter 115 and the erase memory cell 109.

When the control signal RE is enabled, the NMOS transistors 101 and 103 are both turned on, thus the potential on the nodes N1 and N2 are pulled down to a ground level. Meanwhile, both the program memory cell 105 and the erase memory cell 109 are enabled to generate the program memory cell current ION and the erase memory cell current IOFF respectively. The program current ION and the erase current IOFF both accumulate the electric charges on the nodes N1 and N2. It is assumed that the greater the program current ION, the faster the accumulation speed on the node N1. Thus, the inverter 113 is driven and the potential on the node N2 is pulled down to a potential of logic 0, and vice versa.

FIG. 2 schematically shows a circuit diagram of an inverter suitable for the inverters 113 and 115 of FIG. 1. Referring to FIG. 2, a general inverter circuit comprises an NMOS transistor 201 and a PMOS transistor 203. Wherein, a first source/drain of the NMOS transistor 201 is grounded, and a gate is electrically coupled to an input terminal A1 of the inverter. A first source/drain and a gate of the PMOS transistor 203 are electrically coupled to a second source/drain and the gate of the NMOS transistor 201, respectively. In addition, a second/source of the PMOS transistor 203 is electrically coupled to a positive DC bias. Wherein, the second source/drain of the NMOS transistor 201 and the first source/drain of the PMOS transistor 203 are electrically coupled to an output terminal A2 of the inverter.

Referring to FIGS. 1 and 2, in the conventional sensing amplifier, when the transistors 101 and 103 are turned on and the potential on the nodes N1 and N2 are pulled down to the ground level, the program memory cell current ION and the erase memory cell current IOFF will accumulate the electric charges on the nodes N1 and N2. Moreover, the PMOS transistor (e.g. the PMOS transistor 203) in the inverters 113 and 115 will generate a drain current, which also accumulates the electric charges on the nodes N1 and N2. Accordingly, it is required to increase the current difference between the program memory cell current ION and the erase memory cell current IOFF in order to drive the inverters 113 and 115.

In addition, while accumulating the electric charges on the nodes N1 and N2, if noise interference occurs, the inverters 113 and 115 both easily fail to operate due to the impact of the noise.

SUMMARY OF THE INVENTION

Therefore, it is an object of the present invention to provide a sensing amplifier that only requires smaller sensing current difference for providing a lower sensing error rate.

In the present invention, first a program cell current sensing circuit used for a sensing amplifier is provided. The program cell current sensing circuit comprises a first transistor, a second transistor, a third transistor and a program memory cell. Wherein, a first source/drain of the first transistor is grounded; a gate of the first transistor is electrically coupled to a first control signal; and a second source/drain of the first transistor receives a program current provided by the program memory cell. In addition, a second source/drain of the first transistor is electrically coupled to a gate of the third transistor, and a first source/drain of the third transistor is electrically coupled to a second source/drain of the second transistor. A first source/drain of the second transistor is grounded, and a gate is electrically coupled to the inverse first control signal. Moreover, the present invention further comprises a fourth transistor, and the electrical characteristic of the fourth transistor is opposite to the electrical characteristic of the first transistor, the second transistor and the third transistor. Similarly, a gate of the fourth transistor is electrically coupled to the inverse first control signal; a first source/drain of the fourth transistor is electrically coupled to a second source/drain of the third transistor; and a second source/drain of the fourth transistor is electrically coupled to a DC bias.

In addition, the present invention further provides an erase cell current sensing circuit used for a sensing amplifier. The erase cell current sensing circuit comprises a first transistor, a second transistor, a third transistor and an erase memory cell. Wherein, a first source/drain of the first transistor is grounded; a gate of the first transistor is electrically coupled to a first control signal; and a second source/drain of the first transistor receives an erase current provided by the erase memory cell. In addition, a second source/drain of the first transistor is electrically coupled to a gate of the third transistor, and a first source/drain of the third transistor is electrically coupled to a second source/drain of the second transistor. A first source/drain of the second transistor is grounded, and a gate of the second transistor is electrically coupled to the inverse first control signal. Moreover, the present invention further comprises a fourth transistor, and the electrical characteristic of the fourth transistor is opposite to the electrical characteristic of the first transistor, the second transistor and the third transistor. Similarly, a gate of the fourth transistor is electrically coupled to the inverse first control signal; a first source/drain of the fourth transistor is electrically coupled to a second source/drain of the third transistor; and a second source/drain of the fourth transistor is electrically coupled to a DC bias.

In summary, the sensing amplifier provided by the present invention comprises a latch circuit, a program memory cell, an erase memory cell; and further comprises a first transistor, a second transistor, a third transistor and a fourth transistor. Wherein, the latch circuit comprises a first input/output terminal and a second input/output terminal. The first source/drain of the first transistor is grounded; the gate of the first transistor is electrically coupled to a first control signal; and the second source/drain of the first transistor receives the program current provided by the program memory cell. The second source/drain of the first transistor is electrically coupled to the gate of the third transistor, and the first source/drain of the third transistor is electrically coupled to the second source/drain of the second transistor. In addition, the first source/drain of the second transistor is grounded, and the gate of the second transistor is electrically coupled to the inverse first control signal. Moreover, the electrical characteristic of the fourth transistor is opposite to the electrical characteristic of the first transistor, the second transistor and the third transistor. The gate of the fourth transistor is electrically coupled to the inverse first control signal; the first source/drain of the fourth transistor is electrically coupled to the second source/drain of the third transistor and the first input/output terminal of the latch circuit; and the second source/drain of the fourth transistor is electrically coupled to a DC bias. Furthermore, the present invention further comprises a fifth transistor, a sixth transistor, a seventh transistor and an eighth transistor. Wherein, the fifth, the sixth, the seventh, and the eighth transistors are corresponding to the first, the second, the fifth and the fourth transistors, respectively. In addition, the circuit configured by the fifth to the eighth transistors and the erase memory cell is symmetrical to the circuit configured by the first to the fourth transistors and the program memory cell.

For driving the latch circuit, the electric charges accumulated by the program current and the erase current must overcome a threshold voltage of the third transistor or the seventh transistor. Therefore, the sensing amplifier of the present invention can provide a lower sensing error rate by using a smaller sensing current difference.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF PREFERRED
EMBODIMENTS

The preferred embodiments of the present invention are described in greater detail with referring to the accompanying drawings hereinafter. Different types of the transistors such as the NMOS transistor and the PMOS transistor are utilized in the preferred embodiment of the present invention. However, the transistors may be replaced with another type by one of the ordinary skills in the art based on the physical requirement, which does not depart from the main spirit of the present invention.

Figure 3:
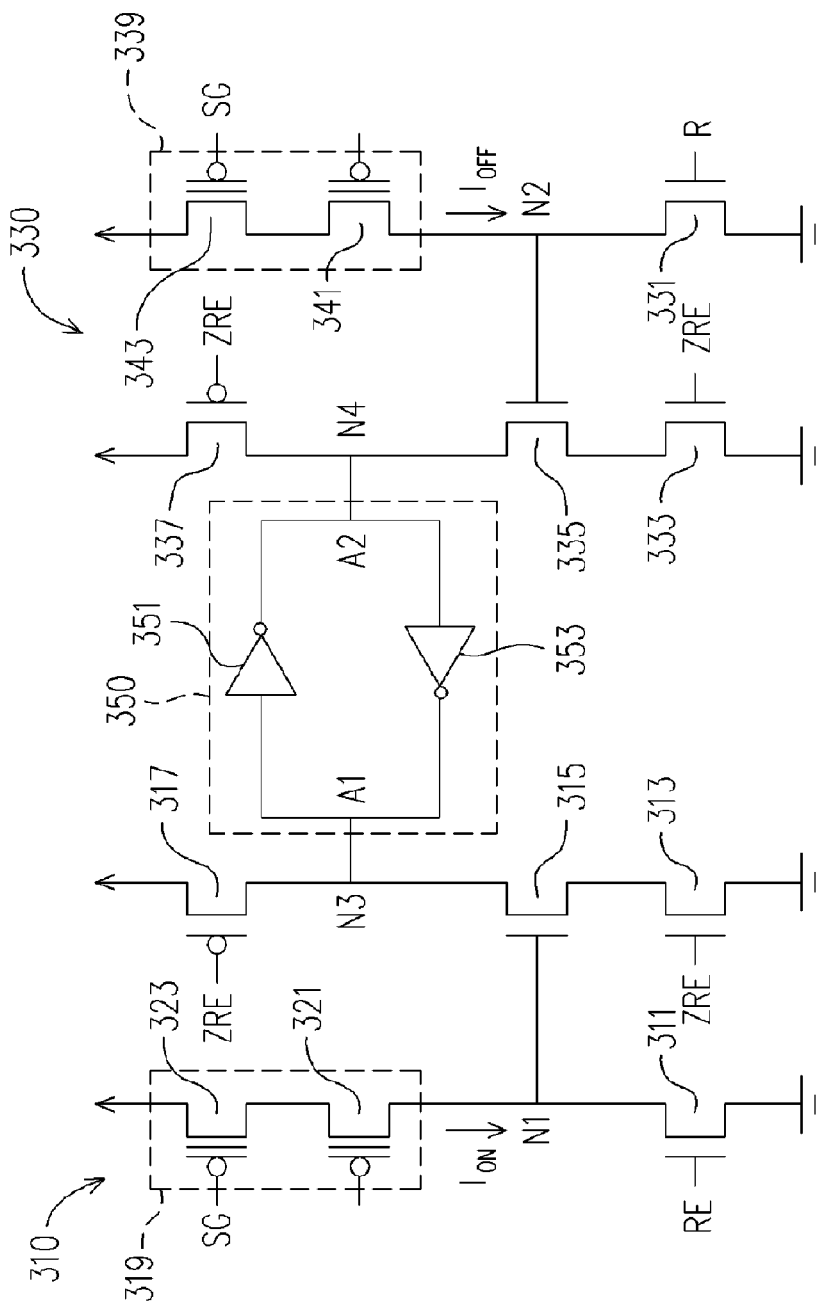
FIG. 3 schematically shows a circuit diagram of a sensing amplifier according to a preferred embodiment of the present invention.

FIG. 3 schematically shows a circuit diagram of a sensing amplifier according to a preferred embodiment of the present invention. Referring to FIG. 3, the sensing amplifier provided by the present invention comprises a program cell current sensing circuit 310, an erase cell current sensing circuit 330 and a latch circuit 350. Wherein, the program cell current sensing circuit 310 comprises three NMOS transistors 311, 313, 315, a PMOS transistor 317 and a program memory cell 319.

In the program cell current sensing circuit 310, the first source/drain of the NMOS transistor 311 is grounded; the gate thereof is electrically coupled to a control signal RE; and the second source/drain of the NMOS transistor 313 receives a program memory cell current ION provided by the program memory cell 319. In addition, the first source/drain of the NMOS transistor 313 is grounded, and the gate of the NMOS transistor 313 receives a control signal ZRE, wherein the phase of the control signal ZRE is opposite to the phase of the control signal RE. The first source/drain and the gate of the NMOS transistor 315 are electrically coupled to the second source/drain of the NMOS transistors 313 and 311, and the second source/drain of the NMOS transistor 315 is electrically coupled to the first input/output terminal A1 of the latch circuit 350 and the first source/drain of the PMOS transistor 317. Moreover, the gate and the second source/drain of the PMOS transistor 317 are electrically coupled to the control signal ZRE and a DC bias, respectively.

Here, the program memory cell 319 may be any type of memory component. In the present embodiment, the program memory cell 319 may comprise two PMOS memory components 321 and 323. Wherein, the first source/drain of the PMOS memory component 321 is electrically coupled to the second source/drain of the NMOS transistor 311, and the second source/drain of the PMOS memory component 321 is electrically coupled to the first source/drain of the PMOS memory component 323. In addition, the gate and the second source/drain of the PMOS memory component 323 are electrically coupled to a control signal SG and the DC bias, respectively.

The erase cell current sensing circuit 330 symmetrical to the program cell current sensing circuit 310 also comprises three NMOS transistors 331, 333, 335, a PMOS transistor 337 and an erase memory cell 339. Similar to the program cell current sensing circuit 310, the second source/drain of the NMOS transistor 331 is grounded; the gate NMOS transistor 331 is electrically coupled to the control signal RE; and the first source/drain of the NMOS transistor 331 receives an erase memory cell current IOFF provided by the erase memory cell 339. In addition, the first source/drain of the NMOS transistor 333 is grounded, and the gate of the NMOS transistor 333 receives the control signal ZRE. The first source/drain and the gate of the NMOS transistor 335 are electrically coupled to the second source/drain of the NMOS transistors 333 and 331, and the second source/drain of the NMOS transistor 335 is electrically coupled to the second input/output terminal A2 of the latch circuit 350 and the first source/drain of the PMOS transistor 337. Moreover, the gate and the second source/drain of the PMOS transistor 337 are electrically coupled to the control signal ZRE and the DC bias, respectively.

In addition, the erase memory cell 339 may comprise two PMOS memory components 341 and 343. Wherein, the first source/drain of the PMOS memory component 341 is electrically coupled to the second source/drain of the NMOS transistor 331, and the second source/drain of the PMOS memory component 341 is electrically coupled to the first source/drain of the PMOS memory component 343. Moreover, the gate and the second source/drain of the PMOS memory component 343 are electrically coupled to the control signal SG and the DC bias, respectively.

In the preferred embodiment of the present invention, the latch circuit 350 may comprise two inverters 351 and 353. Wherein, the input terminal of the inverter 351 is electrically coupled to the second source/drain of the NMOS transistor 315 through the first input/output terminal A1 of the latch circuit 350, and the output terminal of the inverter 351 is electrically coupled to the second source/drain of the NMOS transistor 335 through the second input/output terminal A2 of the latch circuit 350. Moreover, the input terminal and the output terminal of the inverter 352 are electrically coupled to the output terminal and the input terminal of the inverter 351, respectively.

Figure 1:
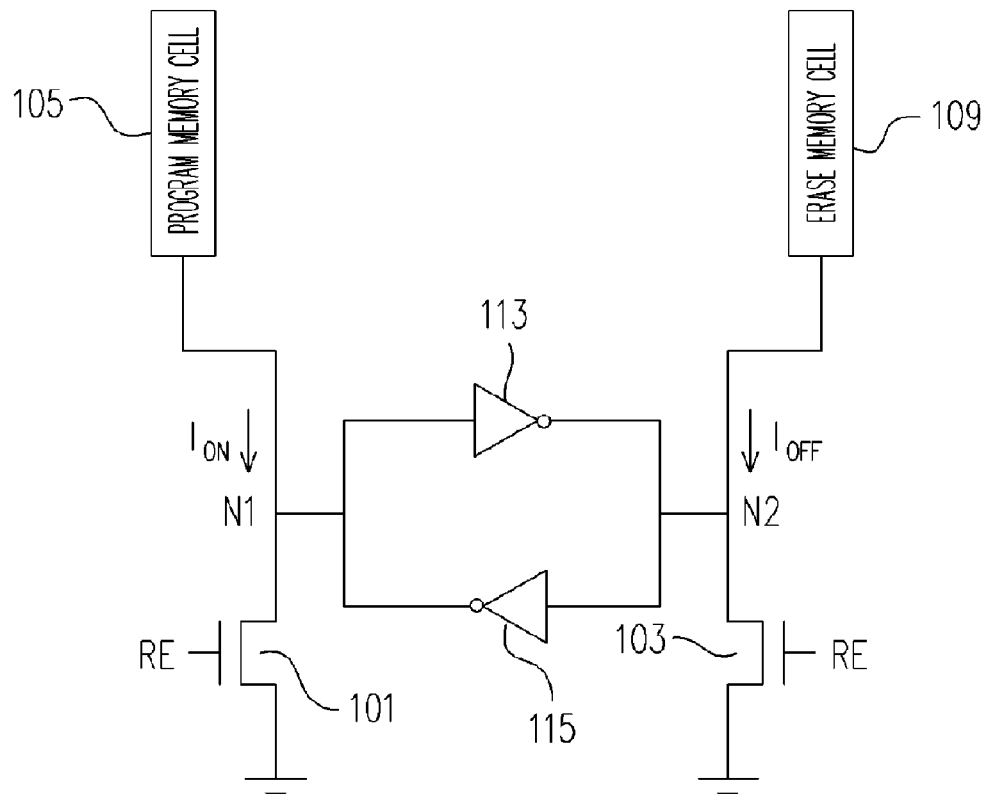
FIG. 1 schematically shows a circuit diagram of a conventional sensing amplifier.
Figure 2:
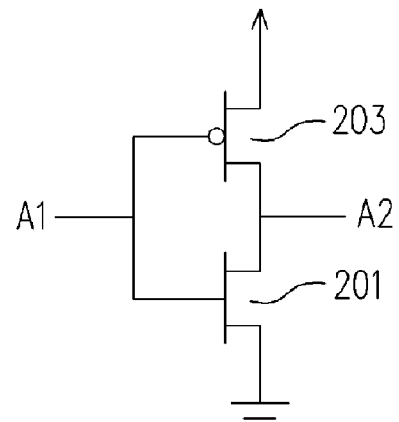
FIG. 2 schematically shows a circuit diagram of an inverter.

In some optional embodiments, the inverters 351 and 353 may be embodied by the circuit shown in FIG. 2.

Figure 4:
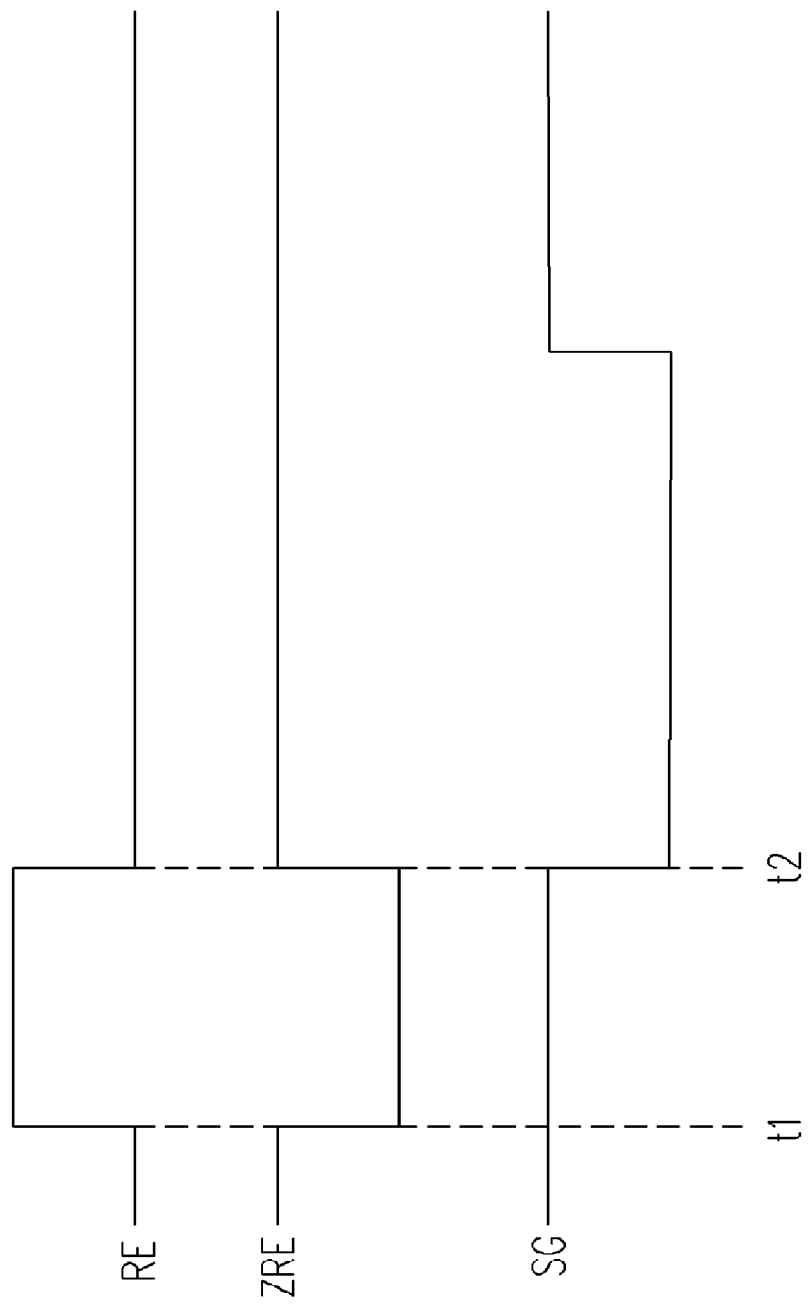
FIG. 4 schematically shows a timing diagram of a control signal according to a preferred embodiment of the present invention.

FIG. 4 schematically shows a timing diagram of a control signal according to a preferred embodiment of the present invention. Referring to FIGS. 3 and 4, first it is assumed that the control signal RE is enabled at the time point t1, meanwhile the NMOS transistors 311 and 331 are both turned on, and the potential on the nodes N1 and N2 is pulled down to the ground level. Since the phase of the control signal ZRE is opposite to the phase of the control signal RE, the control signal ZRE is disabled at the time point t1, thus the PMOS transistors 317 and 337 are both turned on, and the NMOS transistors 313 and 333 are turned off, as well as the potential on the nodes N3 and N4 are pulled up to the potential of the DC bias.

Then, at the time point t2, the control signal RE is disabled and the control signal ZRE is enabled, thus the NMOS transistors 311 and 331 and the PMOS transistors 317 and 337 are turned off, and the NMOS transistors 313 and 333 are turned on. Meanwhile, the control signal SG is pulled down from the high potential to the low potential, thus the PMOS transistors 323 and 343 are turned on, and the electric charges are accumulated on the nodes N1 and N2 by the program memory cell current ION and the erase memory cell current IOFF generated by the program memory cell 319 and the erase memory cell 339, respectively.

When the program memory cell current ION is higher, the speed of accumulating the electric charges on the node N1 is higher than the speed of accumulating the electric charges on the node N2. In case the amount of the electric charges accumulated on the node N1 is high enough to overcome the threshold voltage of the NMOS transistor 315, the NMOS transistor 315 will be turned on and the potential on the node N3 is thus pulled down to the ground level. Once the potential on the node N3 is pulled down to the ground level, the latch circuit 350 is driven to pull up the potential on the node N4 to the potential of logic 1. Oppositely, when the erase memory cell current IOFF is higher than the program memory cell current ION, the potential on the node N4 will be pulled down to the ground level and the latch circuit 350 is driven to pull up the potential on the node N3 to the potential of logic 1.

In summary, since the nodes N1 and N2 are electrically coupled to the gate of the transistor, in order to drive the latch circuit, the amount of the accumulated electric charges must be higher than the threshold voltage of the transistor. Accordingly, the latch circuit will not be impacted by the noise which causes fault operation. In addition, the sensing current difference between the program memory cell current and the erase memory cell current required by the present invention is lower, such that the sensing amplifier provided by the present invention can operate in a lower supply voltage.

Although the invention has been described with reference to a particular embodiment thereof, it will be apparent to one of the ordinary skills in the art that modifications to the described embodiment may be made without departing from the spirit of the invention. Accordingly, the scope of the invention will be defined by the attached claims not by the above detailed description.

What is claimed is:

1. A program cell current sensing circuit for a sensing amplifier, comprising:
   a first transistor having a first source/drain grounded, and a gate electrically coupled to a first control signal;
   a program memory cell providing a program current to a second source/drain of the first transistor based on a second control signal;
   a second transistor having a first source/drain grounded, and a gate electrically coupled to the inverse first control signal;
   a third transistor having a gate and a first source/drain electrically coupled to the second source/drain of the first transistor and the second transistor, respectively; and
   a fourth transistor having a gate electrically coupled to the inverse first control signal, a first source/drain electrically coupled to a second source/drain of the third transistor, and a second source/drain of the fourth transistor electrically coupled to a DC bias,
   wherein, the electrical characteristic of the fourth transistor is opposite to the electrical characteristic of the first transistor, the second transistor and the third transistor.

2. The program cell current sensing circuit for the sensing amplifier of claim 1, wherein the first transistor, the second transistor and the third transistor are NMOS transistors and the fourth transistor is a PMOS transistor.

3. The program cell current sensing circuit for the sensing amplifier of claim 1, wherein the program memory cell comprises:
   a fifth PMOS transistor having a first source/drain electrically coupled to the second source/drain of the first transistor; and
   a sixth PMOS transistor having a gate electrically coupled to the second control signal, a first source/drain electrically coupled to a second source/drain of the fifth PMOS transistor, and a second source/drain of the sixth PMOS transistor electrically coupled to the DC bias.

4. The program cell current sensing circuit for the sensing amplifier of claim 1, wherein the sensing amplifier further comprises a latch circuit having an input/output terminal electrically coupled to the second source/drain of the third transistor.

5. The program cell current sensing circuit for the sensing amplifier of claim 4, wherein the latch circuit comprises:
   a first inverter having an input terminal electrically coupled to the second source/drain of the third transistor; and
   a second inverter having an output terminal and an input terminal electrically coupled to an input terminal and an output terminal of the first inverter respectively.

6. An erase cell current sensing circuit for a sensing amplifier, comprising:
- a first transistor having a first source/drain grounded, and a gate electrically coupled to a first control signal;
- an erase memory cell providing an erase current to a second source/drain of the first transistor based on a second control signal;
- a second transistor having a first source/drain grounded, and a gate electrically coupled to the inverse first control signal;
- a third transistor having a gate and a first source/drain electrically coupled to the second source/drain of the first transistor and the second transistor, respectively; and
- a fourth transistor having a gate electrically coupled to the inverse first control signal, a first source/drain electrically coupled to a second source/drain of the third transistor, and a second source/drain of the fourth transistor electrically coupled to a DC bias,
- wherein, the electrical characteristic of the fourth transistor is opposite to the electrical characteristic of the first transistor, the second transistor and the third transistor.

7. The erase cell current sensing circuit for the sensing amplifier of claim 6, wherein the first transistor, the second transistor and the third transistor are NMOS transistors, and the fourth transistor is a PMOS transistor.

8. The erase cell current sensing circuit for the sensing amplifier of claim 6, wherein the erase memory cell comprises:
- a fifth PMOS transistor having a first source/drain electrically coupled to the second source/drain of the first transistor; and
- a sixth PMOS transistor having a gate electrically coupled to the second control signal, a first source/drain electrically coupled to a second source/drain of the fifth PMOS transistor, and a second source/drain of the sixth PMOS transistor electrically coupled to the DC bias.

9. The erase cell current sensing circuit for the sensing amplifier of claim 6, wherein the sensing amplifier further comprises a latch circuit having an input/output terminal electrically coupled to the second source/drain of the third transistor.

10. The erase cell current sensing circuit for the sensing amplifier of claim 9, wherein the latch circuit comprises:
- a first inverter having an input terminal electrically coupled to the second source/drain of the third transistor; and
- a second inverter having an output terminal and an input terminal electrically coupled to an input terminal and an output terminal of the first inverter respectively.

11. A sensing amplifier, comprising:
- a latch circuit having a first input/output terminal and a second input/output terminal;
- a first transistor having a first source/drain grounded, and a gate electrically coupled to a first control signal;
- a program memory cell providing a program current to a second source/drain of the first transistor based on a second control signal;
- a second transistor having a first source/drain grounded, and a gate electrically coupled to the inverse first control signal;
- a third transistor having a gate and a first source/drain electrically coupled to the second source/drain of the first transistor and the second transistor respectively, and a second source/drain of the third transistor electrically coupled to the first input/output terminal of the latch circuit;
- a fourth transistor having a gate electrically coupled to the inverse first control signal, a first source/drain electrically coupled to the second source/drain of the third transistor, and a second source/drain of the fourth transistor electrically coupled to a DC bias;
- a fifth transistor having a first source/drain grounded, and a gate electrically coupled to the first control signal;
- an erase memory cell providing an erase current to a second source/drain of the fifth transistor based on the second control signal;
- a sixth transistor having a first source/drain grounded, and a gate electrically coupled to the inverse first control signal;
- a seventh transistor having a gate and a first source/drain electrically coupled to the second source/drain of the fifth transistor and the sixth transistor respectively, and a second source/drain of the seventh transistor electrically coupled to the second input/output terminal of the latch circuit; and
- an eighth transistor having a gate electrically coupled to the inverse first control signal, a first source/drain electrically coupled to the second source/drain of the seventh transistor, and a second source/drain of the eighth transistor electrically coupled to the DC bias,
- wherein, the electrical characteristic of the fourth transistor and the eighth transistor is opposite to the electrical characteristic of the first transistor, the second transistor, the third transistor, the fifth transistor, the sixth transistor and the seventh transistor.

12. The sensing amplifier of claim 11, wherein the first transistor, the second transistor, the third transistor, the fifth transistor, the sixth transistor and the seventh transistor are NMOS transistors, and the fourth transistor and the eighth transistor are PMOS transistors.

13. The sensing amplifier of claim 12, wherein the program memory cell comprises:
- a ninth PMOS transistor having a first source/drain electrically coupled to the second source/drain of the first transistor; and
- a tenth PMOS transistor having a gate electrically coupled to the second control signal, a first source/drain electrically coupled to a second source/drain of the ninth PMOS transistor, and a second source/drain of the tenth PMOS transistor electrically coupled to the DC bias.

14. The sensing amplifier of claim 12, wherein the erase memory cell comprises:
- an eleventh PMOS transistor having a first source/drain electrically coupled to the second source/drain of the fifth transistor; and
- a twelfth PMOS transistor having a gate electrically coupled to the second control signal, a first source/drain electrically coupled to a second source/drain of the eleventh PMOS transistor, and a second source/drain of the twelfth PMOS transistor electrically coupled to the DC bias.

15. The sensing amplifier of claim 11, wherein the latch circuit comprises:
- a first inverter having an input terminal electrically coupled to the first input/output terminal of the latch circuit, and an output terminal electrically coupled to the second input/output terminal of the latch circuit; and
- a second inverter having an output terminal and an input terminal electrically coupled to an input terminal and an output terminal of the first inverter, respectively.

\* \* \* \* \*